United States Patent [19]

Nakamura et al.

[11] Patent Number: 4,587,186

[45] Date of Patent: May 6, 1986

[54] MASK ELEMENT FOR SELECTIVE SANDBLASTING AND A METHOD

[75] Inventors: Shohei Nakamura; Yoshimasa Tuji, both of Fuji, Japan

[73] Assignee: Asahi Kasei Kogyo Kabushiki Kaisha, Osaka, Japan

[21] Appl. No.: 601,825

[22] Filed: Apr. 19, 1984

Related U.S. Application Data

[63] Continuation-in-part of Ser. No. 493,909, May 12, 1983, Pat. No. 4,456,680.

[30] Foreign Application Priority Data

May 13, 1982 [JP] Japan ................................ 57-79184
Nov. 14, 1983 [JP] Japan .............................. 58-213472
Nov. 14, 1983 [JP] Japan .............................. 58-213473

[51] Int. Cl.⁴ .................... B24B 1/00; G03C 11/12; G03C 1/80; G03C 1/70
[52] U.S. Cl. ........................ 430/14; 430/18; 430/252; 430/260; 430/262; 430/256; 430/258; 430/271; 430/284; 156/660; 51/310; 51/311; 51/312
[58] Field of Search .......... 51/310, 311, 312; 430/14, 18, 252, 260, 262, 256, 258, 271, 284; 156/660

[56] References Cited

U.S. PATENT DOCUMENTS

| | | | |
|---|---|---|---|
| 1,954,672 | 1/1934 | Kavanaugh | 51/310 |
| 3,210,187 | 4/1960 | Thommes | 430/258 X |
| 3,579,926 | 5/1971 | Gaspari | 51/312 |
| 3,808,751 | 5/1974 | Usui | 51/312 |
| 4,430,416 | 2/1984 | Goto et al. | 430/263 |

FOREIGN PATENT DOCUMENTS

| | | | |
|---|---|---|---|
| 0065072 | 5/1980 | Japan | 51/310 |
| 55-95589 | 7/1980 | Japan . | |

*Primary Examiner*—John E. Kittle
*Assistant Examiner*—Cynthia Hamilton
*Attorney, Agent, or Firm*—Sprung Horn Kramer & Woods

[57] ABSTRACT

A mask element for selective sandblasting comprising a support film layer and, superimposed thereon in the following order, a retainer film layer of a water-insoluble cellulose derivative and a photoresist layer of a pattern mask, said photoresist layer of pattern mask being adapted to adhere to the surface of an article body to be engraved with a strength such that the mask is not detached therefrom during sandblasting. By the use of the mask element of the present invention, a pattern exactly corresponding to that of the mask, even if it is very fine, can be engraved on an article body nicely.

7 Claims, 2 Drawing Figures

MASK ELEMENT FOR SELECTIVE SANDBLASTING AND A METHOD

This application is a continuation-in-part of our U.S. application Ser. No. 493,909 filed May 12, 1983, U.S. Pat. No. 4,456,680.

This invention relates to a mask element for selective sandblasting and a method for producing a pattern-engraved article. More particularly, this invention is concerned with an improved mask element having a sticky photoresist layer of a predetermined pattern mask which is capable of strongly adhering to the surface of an article body to be engraved by sandblasting. Due to the strong adherence of the pattern mask to an article body, the pattern mask is not detached from the article body during sandblasting so that the pattern of the mask, even if it is a very fine one, can be transferred exactly to the article body. This invention is also concerned with a method for producing a pattern-engraved article by the use of the above-mentioned improved mask element.

Sandblasting, viz. a well-known technique for surface treatment in which steel grit, sand or other abrasive material is blown against an article body, is useful for producing an engraved surface on a variety of materials such as glass, stone, ceramics, wood, synthetic resin, metal and leather. To engrave a desired image on such a material, usually, a mask element having a pattern corresponding to the desired image is attached to the material, followed by engraving of the vacant portions of said pattern by blowing steel grit, sand or other abrasive material thereagainst. The present invention is directed to an improved mask element for sandblasting.

Conventionally, sandblasting has been effected by a method in which a pattern mask prepared manually from rubber or paper is attached to an anticle to be engraved through medium of an adhesive. This method is, however, not only time-consuming but also has such a drawback that a mask element having a fine pattern cannot be obtained.

To overcome the drawbacks accompanying the conventional technique of sandblasting, various proposals have recently been made by which a photopolymerizable composition is used in preparing a mask for sandblasting.

The term "photopolymerizable composition" as used herein means the composition which is hardened by polymerization and/or crosslinking reaction upon exposure to actinic radiation.

For example, in Japanese Patent Application Publication Specification No. 35681/1971, there is disclosed a method of preparing a mask for sandblasting which comprises applying a photopolymerizable composition directly on an article body to be engraved, exposing the resulting photopolymerizable composition layer to actinic radiation to form a polymeric image therein and removing the unexposed portion of said layer by a developer. However, this method has such disadvantages that it is difficult to form a mask layer on a curved surface, and that a great deal of labor is required when a mask is applied on an article with large dimensions.

Further, as disclosed in Japanese Patent Application Laid-Open Specification No. 53-99258/1978, it is known to prepare a mask for sandblasting by a process which comprises interposing a liquid photopolymerizable composition layer between a support film and a protective film to form a photosensitive element, exposing the photosensitive element on its side of the protective film through an image-bearing transparency to actinic radiation, stripping the protective film, and washing away the unexposed portions of the photopolymerizable composition layer, followed by drying the resulting element. The so-prepared mask for sandblasting is attached to an article body to be engraved with the surface of the mask remote from the support film disposed in contact with the surface of the article body. Then, the support film is stripped, and subjected to sandblasting. In this prior art, although it is required that the resulting photoresist layer have a certain degree of stickiness to an article body to be engraved, the mask element has not any additional adhesive layer between the support film and the photopolymerizable composition layer. Hence, this prior art process has an inherent drawback that coming-off of high-precision portions of the image, such as fine dots and lines, from their respective roots tends to occur, at the time of development for washing away the non-hardened portions upon exposure, due to the above-mentioned requirement of the support film. Moreover, there is another disadvantage that due to the above-mentioned stickiness of the photoresist layer, there is caused a certain degree of peeling resistance between the support film and the photoresist layer and, hence, when the support film is stripped off after application of the mask element to an article body, chipping of the photoresist layer, especially at portions corresponding to the fine dots and lines of the image, tends to occur. On the other hand, this prior art reference teaches the use of a composition comprising an unsaturated polyester as the unsaturated polymer component of the photopolymerizable composition, and that by the use of such composition, it is possible to render the surface of the ultimate mask sticky by adjusting the degree of photopolymerization so that the mask can be attached to an article body to be engraved without using an adhesive. However, as mentioned above, due to this stickiness, chipping of the pattern mask layer at the fine dots and lines tends to occur at the time of stripping of the support film therefrom. Moreover the level of adhesion attained between the mask layer and the article body is not sufficient, and, hence, the mask is caused to peel off from the article body during the operation of sandblasting. To avoid this trouble, it is actually necessary to apply an adhesive to the photoresist layer on its side to be attached to the article body, thereby compensating for the insufficient stickiness between the mask and the article body.

In Japanese Patent Application Laid-Open Specification No. 96270/1980, there is disclosed a method for producing a pattern-engraved article which comprises forming a pattern mask layer from a photopolymerizable composition on an adhesive layer provided on a support film, attaching the surface, remote from the mask layer, of the support film to the surface of an article body to be engraved by the use of an adhesive, and effecting sandblasting over the pattern mask layer to destroy and remove the support film and then engrave the article body. This method, however, has such disadvantages that it takes a prolonged period of time to destroy and remove the support film by sandblasting and that the attachment of the mask to the article body is troublesome due to the use of an adhesive.

Figure 2:
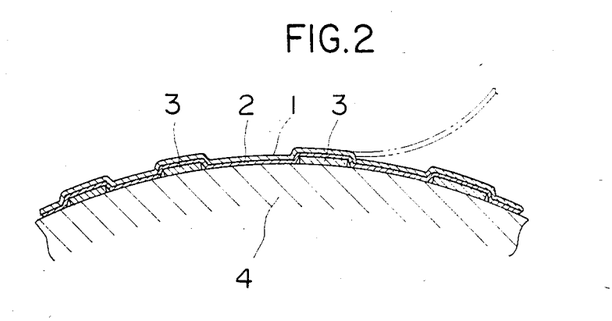
FIG. 2 shows a diagrammatic cross-sectional view illustrating how the conventional mask element disclosed in Japanese Utility Model Application Laid-Open Specification No. 89555/1980 is attached onto the surface of an article body to be engraved by sandblasting.

Japanese Utility Model Application Laid-Open Specification No. 89555/1980 (corresponding to U.S. Pat. No. 4,430,416 issued Feb. 7, 1984) discloses a mask element comprising a support film layer and, superimposed on the layer in the following order, an intermediate layer and a photoresist layer of a predetermined pattern mask. Referring to the accompanying drawing marked "PRIOR ART", an intermediate layer 2, which is strippably provided on a support film 1, can adhere to the surface of an article body 4 to be engraved by pressing, for example with fingers. The intermediate layer 2 is destroyable by sandblasting. With respect to this mask element, the adhesion of a photoresist layer of pattern mask 3 to an article body is not sufficient. To cope with this insufficient adhesion, the intermediate layer 2 is adapted to adhere to the article body 4, thereby enabling the mask to be securely attached onto the article body. The mask element, on its side of the photoresist layer, is attached to the surface of an article body 4. Then, the support film 1 is removed, and sandblasting is carried out. First, the intermediate layer 2 is destroyed and, next, the article body 4 is engraved. At the time of destroying the intermediate layer 2, such troubles that portions of the mask, especially those corresponding to fine image, are chipped off by sandblasting tend to occur due to the above-mentioned insufficient adhesion of the mask 3 to the article body 4. Besides this inherent problem, this method has such drawbacks that, if a very sticky intermediate layer 2 is employed, portions of the pattern mask are chipped off at the time of stripping the support film 1 from the intermediate layer 2, and that, where a fine image is applied and hence the vacant portions of the mask are narrow, such pressing of the intermediate layer 2 to the surface of an article body 4 is difficult.

With a view to developing a mask element which is free from any of the above-mentioned drawbacks, the present inventors have made intensive investigations. As a result, it has unexpectedly been found that an excellent mask element having a fine pattern mask which is not damaged at the time of stripping the support film or effecting sandblasting can be obtained by employing a photoresist layer of a pattern mask adapted to adhere to the surface of an article body to be engraved with a strength such that the mask is not detached therefrom during sandblasting and by interposing a retainer film layer of a water-insoluble cellulose derivative, which can be easily destroyed by sandblasting, between the support film layer and the pattern mask layer. Based on this novel finding, the present inventors have completed this invention.

It is, therefore, an object of the present invention to provide an improved mask element which is free from any of the above-described drawbacks experienced in the prior art.

The foregoing and other objects, features and advantages of the present invention will be apparent to those skilled in the art from the following detailed description and appended claims taken in connection with the accompanying drawing in which:

In one aspect of the present invention, there is provided a mask element for selective sandblasting, which comprises a support film layer and, superimposed on the support film layer in the following order, a destroyable retainer film layer of a water-insoluble cellulose derivative and a sticky photoresist layer of a predetermined pattern mask constituted by solid image portions and vacant image portions and adapted to adhere to the surface of an article body to be engraved with a strength such that the mask is not detached therefrom during sandblasting, said support film layer being adapted to be stripped from the destroyable retainer film layer while maintaining adherence of the destroyable retainer film layer to the photoresist layer, said destroyable retainer film layer being adapted to be destroyed by sandblasting while said solid portions of the photoresist layer being resistant to sandblasting.

As the suitable support film layer for preparing the mask element of the present invention, there can be mentioned, for example, transparent films of synthetic resins, such as polypropylene, polyesters, polyvinyl chloride, polycarbonate, polystyrene and polyethylene, and sheets of metals, such as steel and aluminum. In general, the support film layer has a thickness of from 50 $\mu$m to 1 mm. A support film having a thickness greater than 1 mm is not suitable because the handling thereof in forming a mask element becomes difficult. A support film having a thickness smaller than 50 $\mu$m is also not suitable because the nerve of the film is insufficient so that the function of the support cannot be fulfilled.

The destroyable retainer film layer to be interposed between the photoresist layer of pattern mask obtained from a photopolymerizable composition and the support film layer in the present invention may be preferably composed of a water-insoluble cellulose derivative. The retainer film layer, itself, has not a stickiness and does not adhere to the surface of an article body of glass, stone, ceramics and other materials to be engraved. From the retainer film layer, the support film layer may be readily stripped. However, the retainer film layer is attached to the photoresist layer of pattern mask with a strong adherence. This is so because the strong adherence, despite the absence of stickiness, is imparted between the photoresist layer and the retainer film layer at the time of photopolymerization of the photopolymerizable composition. The retainer film layer is destroyable by sandblasting.

The destroyable retainer film layer of a water-insoluble cellulose derivative must be insoluble in an aqueous developer, such as water per se, alkaline aqueous solution and aqueous solution of surface-active agent, in order to prevent the polymeric image from parting at the time of development. The destroyable retainer film layer is useful to prevent the pattern mask layer from being detached from an article body at the time of stripping the support film layer. From the viewpoint of the workability of stripping, it is preferred that the peeling resistance between the destroyable retainer film layer and the support film layer be less than 10 g/cm as measured according to the method described later.

Of the cellulose derivatives employed for preparing the destroyable retainer film layer, alkylcelluloses, such as ethylcellulose and methylcellulose, and cellulose monocarboxylic esters, such as cellulose acetate and cellulose acetate butylate, are preferred from the viewpoint of increased insolubility in an aqueous developer.

In general, the destroyable retainer film layer to be employed in the present invention has a thickness of from 0.5 to 20 microns. A retainer film layer having a thickness smaller than 0.5 micron is not suitable because its capability of retaining of the polymeric image becomes insufficient. A retainer film layer having a thickness greater than 20 microns is also not suitable because production of a composite film in which the retainer film layer is superimposed on a support film layer becomes difficult, and because the use of a thick film is not economical.

The photoresist layer of pattern mask to be incorporated in the mask element of the present invention functions as a resist layer against sandblasting and has such a strong adherence to articles to be engraved as 300 g/cm or more in terms of peeling resistance as measured at 20° C. according to the method described later. The peeling resistance is dependent on the smoothness of the surface of the article body, but is substantially independent of the kind of material of the article body. Where the peeling resistance is below 300 g/cm, the tendency of separation of the mask from the article body during the sandblasting disadvantageously increases. Moreover, it is preferred that the elongation at break and 100% modulus, as measured according to the methods described later, of the photoresist layer of pattern mask be 100% or more and 500 Kg/cm$^2$ or less, respectively. Photoresist layers having an elongation at break smaller than 100% and a 100% modulus greater than 500 Kg/cm$^2$ tend to be readily destroyed by sandblasting. Hence, they do not give an effective masking against sandblasting.

The mask element of the present invention may be produced according to a process which comprises the steps of: (1) interposing a liquid photopolymerizable composition layer between a destroyable retainer film layer strippably attached onto the lower surface of a support film layer and a transparent soluble peel-aid film layer superimposed on a transparent protective film layer, thereby to form a photosensitive element, said transparent soluble peel-aid film layer having a peeling resistance of 10 g/cm or less against the transparent protective film layer and being soluble in an aqueous developer; (2) image-wise exposing the photosensitive element on its side of the transparent protective film layer through an imagebearing transparency to convert the liquid photopolymerizable composition layer to a layer having polymeric image portions and non-polymeric image portions; (3) stripping the transparent protective film layer from the transparent soluble peel-aid film layer; and (4) washing away with the aqueous developer the transparent soluble peel-aid film layer and the non-polymeric image portions of the layer having polymeric image portions and nonpolymeric image portions, thereby to provide polymeric image portions having their respective upper ends connected to the destroyable retainer film layer on its lower surface and having their respective free lower ends to be attached onto the surface of an article body for sandblasting, said support film layer being adapted to be stripped from the destroyable retainer film layer while maintaining adherence of the destroyable retainer film layer to the respective upper ends of the polymeric image portions, said destroyable retainer film layer being adapted to be destroyed by sandblasting.

The transparent protective film layer to be employed in the above-mentioned process is composed of a synthetic resin. As the suitable synthetic resin, there can be mentioned various kinds of polymers, such as polypropylene, polyesters, polyethylene, polystyrene, polyvinyl chloride, polyamides, cellulose acetate and polycarbonate. These synthetic resins may be used either singly or in mixture. In general, the transparent protective film layer has a thickness of from 5 to 50 microns. A protective film layer having a thickness greater than 50 microns is not suitable because the reproducibility of an image is decreased due to the increased scattering of light within the film. A protective film layer having a thickness smaller than 5 microns is also not suitable because the handling of the film becomes difficult. In particular, it is preferred that the thickness of the transparent protective film layer to be employed in the above-mentioned process be in the range of from 9 to 25 microns.

It is to be noted that the oxygen permeability of the protective film layer affects the surface stickiness of the ultimate mask element for sandblasting. When the oxygen permeability of the protective film layer is as small as less than $30 \times 10^{-6}$ g/24 hr/m$^2$/mm-thickness/cm Hg(21° C.), the surface stickiness of the ultimate mask markedly drops. Hence, it is preferable to use a protective film layer having an oxygen permeability of $30 \times 10^{-6}$ g/24 hr/m$^2$/mm-thickness/cm Hg(21° C.) in the present invention. From this viewpoint, as the suitable resin for forming the protective film layer, there can be mentioned polypropylene, cellulose esters, polycarbonate, polyethylene and polystyrene. Of them, polypropylene is most suitable because it can form a protective film free from the trouble of the excess elongation during the mounting thereof on an image-bearing transparency and during other procedures and also free from the drawback of wrinkle formation or difficulty in intimate mounting on an image-bearing transparency, which drawback may be attributed to the excess hardness and brittleness of the film.

The transparent soluble peel-aid layer to be employed in the above-mentioned process allows the above-described transparent protective film layer to be readily stripped therefrom and can be dissolved in an aqueous developer, such as water per se, alkaline aqueous solution and aqueous solution of surface-active agent. It is needed that the peeling resistance of the transparent soluble peel-aid layer against the protective film layer be 10 g/cm or less as measured according to the method described later. A film having a peeling resistance greater than 10 g/cm causes the stripping of the protective film to be troublesome, whereby defective products are produced. As the suitable polymer for forming the transparent soluble peel-aid layer to be employed in the above-mentioned process, there can be mentioned, for example, hydroxyalkyl group-containing cellulose ethers, hydroxyalkyl group-containing cellulose esters, carboxyl group-containing cellulose ethers, carboxyl group-containing cellulose esters and partially saponified polyvinyl acetates. The number-average molecular weight of the above-cited resins is in the range of from 10,000 to 500,000 g/mol, preferably from 20,000 to 100,000 g/mol, as measured according to the customary gel permeation chromatography method (using polystyrene as a reference material). With respect to the above-cited ethers, the degree of etherification is in the range of from 10 to 100%, preferably from 40 to 100%. With respect to the above-cited esters, also, the degree of esterification is in the range of from 10 to 100%, preferably from 40 to 100%. As the suitable hydroxyalkyl group-containing cellulose ether, there can be mentioned, for example, hydroxyethylcellulose and hydroxypropylcellulose. As the suitable hydroxyalkyl group-containing cellulose ester, there can be mentioned, for example, cellulose hydroxyacetate. Specific examples of the suitable carboxyl group-containing cellulose ether are carboxymethylcellulose and carboxyethylcellulose. Specific examples of the suitable carboxyl group-containing cellulose ester are esters of cellulose with either at least one member selected from polycarboxylic acids including dicarboxylic and tricarboxylic acids, such as succinic acid, adipic acid, sebacic acid, phthalic acid, isophthalic acid, terephthalic acid and trimellitic acid or a mixture of any of these polycarboxylic acids and a monocarboxylic acid, such as acetic acid, propionic acid, butyric acid or benzoic acid. The carboxyl group of the carboxyl group-containing cellulose ether and ester to be employed in the above-mentioned process may be in the form of a salt. The suitable polymers for forming the transparent soluble peel-aid layer to be employed in the above-mentioned process are not limited to the above-cited polymers, and any polymeric material may be used so far as it can form a film which allows the protective film to be readily stripped therefrom and can be removed by dissolution or dispersion into an aqueous developer at the step of development.

When the oxygen permeability of the soluble peel-aid layer is too small, the curing of the surface of the photopolymerizable or photocrosslinkable composition layer advances, at the step of exposure, to such an extent that the ultimate mask element for sandblasting disadvantageously has a poor stickiness to articles to be engraved. From this viewpoint, the cellulose derivatives having a high oxygen permeability are preferred.

Hydroxyalkyl group-containing cellulose ethers and esters and partially saponified polyvinyl acetate are affected by the moisture absorption during the storage thereof. Therefore, attention should be paid to the storage conditions of such materials. From this viewpoint, carboxyl group-containing cellulose esters and ethers, especially esters of cellulose with a mixture of polycarboxylic acid and monocarboxylic acid, are preferred, which exhibit a low moisture pickup and which are soluble in a weak alkaline aqueous solution and/or an aqueous solution of surface-active agent. Of them, cellulose acetate phthalate is most preferable because it is readily available.

In general, the transparent soluble peel-aid film layer to be employed in the above-mentioned process has a thickness of from 0.1 to 10 microns. A peel-aid film layer having a thickness greater than 10 microns is not suitable because the reproducibility of an image is decreased. A peel-aid film layer having a thickness smaller than 0.1 micron is also not suitable because thickness control during production steps becomes difficult and because troubles, such as pin-hole formation, tend to increasingly occur. It is preferred that the thickness of the transparent soluble peel-aid film layer to be employed in the present invention be in the range of from 0.2 to 5 microns.

The transparent soluble peel-aid film layer can be superimposed on the transparent protective film layer according to customary procedures. For example, the above-cited polymer for forming the peel-aid film layer is dissolved in an appropriate solvent to prepare a solution. Then, the solution is coated on the protective film by means of a bar coater, spin coater or gravure coater, and dried. As the suitable liquid photopolymerizable composition layer to be employed in the above-mentioned process, there can be mentioned various kinds of compositions, including, but not limited thereto, the following composition, which comprises:

as a component (a), an ethylenically unsaturated polyurethane of the fomula:

$$B(XA)_nXB'$$

wherein X represents a urethane residue, A represents a residue of a polyether, a polyester, a block copolymer of polyether and polyester, a mixture thereof or a polybutadiene, n represents an integer of 1 to 10, B represents a radical of a compound of the formula:

$$CH_2{=}C(Z)\underset{\underset{O}{\|}}{C}O-Y$$

in which Z represents a hydrogen atom or a methyl group, and Y represents $-(CH_2)_{m_1}O-$ in which $m_1$ represents an integer of 2 to 6, $$-(CH_2CH-O)_{\overline{m_2}}$$
$$\phantom{-(CH_2}|$$
$$\phantom{-(CH_2C}CH_3$$

in which $m_2$ represents an integer of 1 to 12, or $-(CH_2CH_2O)_{m_3}$ in which $m_3$ represents an integer of 1 to 12, and B' represents a radical of a compound of the formula:

$$CH_2{=}C(Z)\underset{\underset{O}{\|}}{C}O-Y$$

in which Z and Y are as defined above or a radical of a compound of the formula:

$$RO- \text{ or } ROY$$

in which Y is as defined above and R represents an alkyl group having 1 to 8 carbon atoms, as a component (b), an ethylenically unsaturated compound, and as a component (c), a photopolymerization initiator;

the weight proportions of the components (a), (b) and (c) relative to the total of the components (a) and (b) being, respectively, 50 to 98%, 2 to 50% and 0.05 to 10%.

With respect to the component (a), as the suitable X, there may be mentioned, for example, urethane residues from tolylene diisocyanate and hexamethylene diisocyanate. As the suitable A, there may be mentioned, for example, a polyethylene glycol residue, a polypropylene glycol residue, a polytetramethylene glycol residue, a polyethylene glycol-polypropylene glycol residue, a polypropylene glycol adipate residue, a polybutadiene residue and a hydrogenated polybutadiene residue. As the suitable B, there may be mentioned, for example, a 2-hydroxyethyl methacrylate residue, a 2-hydroxypropyl methacrylate residue, a polypropylene glycol methacrylate residue, a polyethylene glycol methacrylate residue and acrylate residues corresponding to the above-mentioned methacrylate residues. As the suitable B', there may be mentioned, for example, an ethanol residue, a propanol residue, a hexanol residue, an octanol residue, a polyethylene glycol monoethyl ether residue and a polypropylene glycol monomethyl ether residue.

To provide a photoresist layer of pattern mask having a sufficient surface stickiness and a sufficient resistance to sandblasting, it is preferred that the unsaturated polyurethane have on the average 1.5 to 1.9 double bonds per molecule, and that the number average molecular weight of the polyurethane be in the range of from 5,000 to 50,000, especially from 10,000 to 30,000. This range of molecular weight may be also be preferable from the viewpoint of facilitated handling of the composition before photopolymerization.

With respect to the component (b), specific examples of the ethylenically unsaturated compound are acrylic acid, methacrylic acid, esters of these acids (for example, alkyl, cycloalkyl, tetrahydrofurfuryl, allyl, glycidyl and hydroxyalkyl acrylates and methacrylates mono and di-acrylates and -methacrylates of alkylene glycols and polyoxyalkylene glycols, trimethylolpropane triacrylate and -methacrylate and pentaerythritol tetraacrylate and -methacrylate), acrylamide, methacrylamide and their derivatives (such as N-methylol acrylamide and methacrylamide, N,N'-alkylene bisacrylamides and methacrylamides, and diacetone acrylamide and methacrylamide), addition-polymerizable unsaturated monomers (such as styrene, vinyl toluene, divinyl benzene, diallyl phthalate, triallyl cyanurate, vinyl acetate or acrylonitrile), unsaturated polyesters, alkyd resins, and unsaturated polyurethane resins (such as polyurethane resins modified with an addition-polymerizable unsaturated monomer having an active hydrogen such as a hydroxyalkyl acrylate and methacrylate).

With respect to the component (c), specific examples of the photopolymerization initiator are benzoin, benzoin alkyl esters, α-methylbenzoin alkyl ethers, α-phenylbenzoin, α-allylbenzoin, 2,2-dimethoxyphenylacetophenon, anthraquinone, chloroanthraquinone, methylanthraquinone, ethylanthraquinone, benzil, diacetyl, acetophenone, ω-bromoacetophenone, α-naphthalenesulfonyl chloride, diphenyl disulfide, and dyes such as eosine and thionine.

It is preferred that the weight proportions of the components (a), (b) and (c) relative to the total of the components (a) and (b) be 50 to 98%, 2 to 50% and 0.05 to 10%, respectively. The above weight proportions are preferred to obtain a photoresist layer of pattern mask having a desirable surface stickiness and a desirable resistance to sandblasting. When the weight proportion of the ethylenically unsaturated compound to the unsaturated polyurethane becomes high, the surface stickiness of the ultimate pattern mask tends to decrease. Hence, when the proportion is relatively high, it is preferable to increase the use of a monofunctional compound as the component (b).

The liquid photopolymerizable composition layer to be employed in the above-mentioned process has a thickness of from 0.05 to 3 mm. A photopolymerizable composition layer having a thickness greater than 3 mm is not suitable because the resolution of image drops. A photopolymerizable composition layer having a thickness smaller than 0.05 mm is also not suitable because the function as a resist layer against sandblasting cannot be fulfilled.

The sources of actinic radiation for exposure which can be used in the above-mentioned process can be freely selected and include, for example, arc lamps, mercury lamps, xenon lamps, ultraviolet fluorescent lamps and sunlight, which contain radiation of a wavelength of 200–800 nm, preferably 300 to 500 nm.

After exposure to actinic radiation, the unexposed portion of the photopolymerizable composition layer is washed away, together with the soluble peel-aid film layer, with a conventional developer, for example, water, an alkaline aqueous solution, such as solutions of NaOH, NaCO$_3$, NaHCO$_3$, borax, sodium phosphate, sodium silicate, triethanolamine, or the like, or an aqueous solution of surface active agent, such as a soap, alkylbenzene sulfonate, alkylsulfonate, alkylamine hydrochlorides, polyoxyalkylene glycol, polyoxyalkylene glycol alkylether, polyoxyalkylene glycol alkylester, sorbitan fatty acid ester, polyoxyalkylene glycol sorbitan acid ester or the like.

As is apparent from the foregoing description of the above-mentioned process, the adherence between the transparent protective film layer and the transparent soluble peel-aid film layer is so weak that the protective film layer can be stripped without adversely affecting the other layers of the photosensitive element after exposure. Further, after development for washing away the transparent soluble peel-aid film layer and the non-polymeric image portions of the layer having polymeric image portions and non-polymeric image portions, the resulting mask element is attached to an article body to be engraved with the respective lower ends of the polymeric image portions adhered to the surface of the article body. The adherence between the respective lower ends of the polymeric image portions of the mask and the surface of the article body to be engraved is sufficiently strong as compared with the adherence between the support film layer and the destroyable retainer film layer. Also, the adherence between the destroyable retainer film layer and the respective upper ends of the polymeric image portions of the layer having polymeric image portions and non-polymeric image portions of the mask is much stronger than that between the support film layer and the destroyable retainer film layer. Hence, the support film layer can be stripped while maintaining adherence of the destroyable retainer film layer to the respective upper ends of the polymeric image portions as well as adherence of the respective lower ends of the polymeric image portions to the article body to be engraved by sandblasting.

The resulting element, which comprises a support film layer and, superimposed on the layer in the following order, a destroyable retainer film layer and a photoresist layer, is allowed to stand at room temperature or dried by means of warm or hot air before attaching to article bodies to be engraved.

The above-mentioned process is useful especially when a photopolymerizable composition which provides, upon exposure and development, a very sticky polymeric image is to be utilized. According to the above-mentioned process, even if the polymeric image produced from the photopolymerizable composition is very sticky, the protective film layer can be readily stripped, and, thereby, a mask for sandblasting which has strong adherence to an article body to be engraved can be produced without occurrence of defective products.

Therefore, in another aspect of the present invention, there is provided a method for producing a pattern-engraved article, which comprises:

(1) adhering to the surface of an article body one surface of a sticky photoresist layer of a predetermined pattern mask constituted by solid image portions and vacant image portions and adapted to adhere to the surface of an article body to be engraved with a strength such that the mask is not detached therefrom during sandblasting, said sticky photoresist layer being attached, on its other surface, to a support film layer through the medium of a destroyable retainer film layer of a water-insoluble cellulose derivative, said support film layer being attached to said destroyable retainer film layer with adherence smaller than the adherence of said sticky photoresist layer to said surface of the article body, said support film layer being adapted to be stripped from the destroyable retainer film layer while maintaining adherence of the destroyable retainer film layer to the photoresist layer, said destroyable retainer film layer being adapted to be destroyed by sandblasting while said solid portions of the photoresist layer being resistant to sandblasting;

(2) striping the support film layer from the destroyable retainer film layer;

(3) blowing an abrasive material against the destroyable retainer film layer to destroy said retainer film layer, thereby causing said vacant image portions of the sticky photoresist layer to be exposed;

(4) further blowing an abrasive material through said vacant image portions against the article body to engrave an image corresponding to that of said vacant image portions on the article body; and (5) removing the solid portions of the photoresist layer to obtain a pattern-engraved article.

Figure 1:
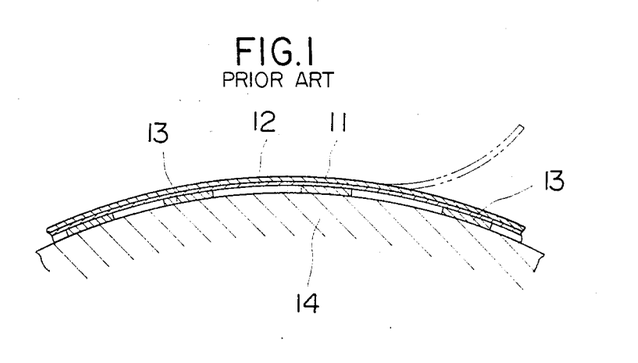
FIG. 1 shows a diagrammatic cross-sectional view illustrating a mask element according to the present invention is attached onto the surface of an article body to be engraved by sandblasting.

Referring now to FIGURE, a mask element comprising a support film layer 11 and, superimposed thereon in the following order, a destroyable retainer film layer 12 and a photoresist layer 13 of a pattern mask constituted by solid image portions and vacant image portions is, on its side of the pattern mask 13, attached to the surface of an article body 14 to be engraved. The photoresist layer 13 has a strong adherence to the article body 14, whereas the retainer film layer 12 has no adherence thereto. The support film layer is readily stripped from the destroyable retainer film layer 12. Then, an abrasive material, such as alundum, corundam and carborundum, is blown against the retainer film layer 12 to destroy the retainer film, thereby causing the vacant image portion of the photoresist layer 13 to be exposed. The abrasive material is further blown through the vacant portions against the article body 14 to engrave an image corresponding to that of the vacant image portions on the article body 14. The period of time of the blowing of an abrasive material to engrave the intended pattern depends of the kind, particle size and blowing pressure of the abrasive material as well as the kind of the article body as substrate, the depth of the engrave pattern and the like. However, it generally takes about several seconds to several minutes per $cm^2$ of the layer to complete the blowing.

After completion of the sandblasting operation, the solid portions of the photoresist layer 13 may be removed from the pattern-engraved article by various known ways. For example, the removal can be attained by soaking in a liquid medium preferably containing a surfactant and brushing. If the article body 14 is a stone, metal, etc., the mask can be removed by combustion.

In practicing the method of the present invention, the mask element, as defined hereinbefore, according to the present invention can be advantageously utilized.

In distributing the mask element of the present invention, a release paper or other material having a release coating is applied onto the surface of the sticky photoresist layer of the mask.

As is apparent from the foregoing, the mask element of the present invention, on its side of the photoresist layer of pattern mask, has a strong adherence to the surface of an article body to be engraved. The mask has an excellent resistance to sandblasting and is not detached from the article body during sandblasting. The support film can be readily stripped due to the presence of the intermediate retainer film layer, which can be readily destroyed by sandblasting. The mask element of the present invention is free from the troubles experienced hitherto, such as chipping of high-precision portions of the mask at the time of stripping of the support film or during the sandblasting. Therefore, by the use of the mask element of the present invention, a pattern exactly corresponding to that of the mask, even if it is very fine, can be engraved on an article body to be engraved nicely.

The present invention will be illustrated in more detail with reference to the following Examples, which should not be construed to be limiting the scope of the present invention.

In the following Examples, and Comparative and Reference Examples, the peeling resistance, elongation at break and 100% modulus were measured according to the following methods.

(1) Measurement of the peeling resistance (a) The mask element is cut off, at its portion which has a length of 30 mm and a width of 13 mm and does not contain on the destroyable retainer film the vacant image portions, to prepare a specimen;

(b) from the specimen, the support film is detached, and the specimen is, on its side of the destroyable retainer film layer, attached to the curved surface of a cylindrical column of aluminum having a height of 13 mm and a diameter of 30 mm through the medium of a double faced adhesive tape having a width of 13 mm or more and a thickness of 120 microns;

(c) the cylindrical column having the specimen attached thereto is applied to the PICMA Tack Tester (manufactured and sold by Toyo Seiki Seisaku-sho, Ltd., Japan) by which the surface of the specimen is pressed onto the surface of a glass plate for 4 seconds under a pressure of 500 g/$cm^2$ and, subsequently, the cylindrical column is pulled from the glass plate at a rate of 30 mm/min to determine the maximum value of strength exerted between the surface of the specimen and that of the column; and (d) the maximum value of strength is divided by 1.3 to obtain a peeling resistance value.

(2) Measurement of the elongation at break and 100% modulus

A 0.3 mm-thick sheet is die-cut by means of a JIS No. 4 dumbell die (JIS: Japanese Industrial Standard). A dumbell specimen is stretched at a rate of 500 mm/min using the Autograph P-100 (a tensile strength tester manufactured and sold by Shimadzu Corporation, Japan) until it breaks. From the increment, at breakage, of the length of the specimen, the elongation (%) at break is calculated. And, from the stress at 100% elongation, the 100% modulus is calculated.

EXAMPLE 1

A 10% by weight solution of cellulose acetate phthalate (having a number average molecular weight of 40,000) in a 6:1 by weight mixture of methyl ethyl ketone and cellosolve acetate was coated, by using a bar coater, on a 22μ-thick polypropylene film, followed by drying. As a result, there was obtained a polypropylene film having thereon a layer of cellulose acetate phthalate having a thickness of 2μ (Film A).

A 20% by weight solution of ethyl cellulose (having a number average molecular weight of 60,000) in methyl ethyl ketone was coated, by using a bar coater, on a 75μ-thick polyethylene terephthalate film, followed by drying. As a result, there was obtained a polyethylene terephthalate having thereon a layer of ethyl cellulose having a thickness of 8μ (Film B).

39 Parts by weight of polypropylene glycol adipate diol (having a number average molecular weight of 2,500), 39 parts by weight of polypropylene glycol (ethylene oxide being addition-bonded to both ends of the polypropylene glycol chain in an amount of 10% by weight, having a number average molecular weight of 2,500) and 6 parts by weight of tolylene diisocyanate (a mixture consisting of 80% by weight of 2,4-isomer and 20% by weight of 2,6-isomer) were reacted to obtain a polyurethane having isocyanate groups at both ends thereof. 15 Parts by weight of 2-hydroxypropyl methacrylate was added to the thus obtained polyurethane, and reaction was effected between the polyurethane and 2-hydroxypropyl methacrylate, whereby an unsaturated polyurethane having methacrylate groups at both ends thereof was obtained. To the thus obtained unsaturated polyurethane, added under agitation were 20 parts by weight of polypropylene glycol monomethacrylate (having a number average molecular weight of 550), 3 parts by weight of diethylene glycol dimethacrylate, 1.5 parts by weight of 2,2-dimethoxyphenyl acetophenone and 0.1 part by weight of 2,6-di-t-butyl-p-cresol, whereby a photopolymerizable composition in the form of liquid was obtained.

A positive photographic film was placed on a 10 mm-thick glass plate. The positive film was then covered with the above-obtained film A in such a way that the polypropylene film in the film A was brought into contact with the positive film. Then, the photopolymerizable composition in the form of liquid was poured into a space defined by the film A and a 0.3 mm-thick spacer placed on the film A. Subsequently, the film B was laminated onto the surface of the photopolymerizable composition in such a way that the layer of ethyl cellulose superimposed on the polyethylene terephthalate film in the film B was brought into contact with the surface of the photopolymerizable composition. Onto the polyethylene terephthalate film of the film B, a 10 mm-thick glass plate was placed to obtain an element. Each corner of the resulting element was clasped with a clip, thereby controlling the entire thickness of the element. The element was exposed, through the positive photographic film, to actinic radiation from a 2 KW high pressure mercury lamp placed at a distance of 50 cm for 80 seconds. After exposure to actinic radiation, the glass plates and the positive film were removed, and the polypropylene film in the film A was stripped off. At that time, the peeling resistance between the polypropylene film and the layer of cellulose acetate phthalate was measured according to the above-described method and found to be as small as 1 g/cm. Chipping of the polymeric image generated by exposure of the photopolymerizable composition layer was not observed. Subsequently, the unexposed, non-polymeric image portions of the photopolymerizable composition were washed away, together with the layer of cellulose acetate phthalate, by spraying a 2% by weight aqueous solution of surface-active agent (Lipon F; manufactured and sold by Lion Corporation, Japan) for 150 seconds at a pressure of 0.8 kg/cm. Any chipping of the polymeric image generated by exposure of the photopolymerizable composition was not observed. The thus treated element was dried for 10 minutes at 60° C. to obtain a mask element for sandblasting.

After cooling to 20° C., the thus obtained mask element for sandblasting was subjected to measurement of the peeling resistance against a glass plate. The peeling resistance of the mask for sandblasting against a glass plate was found to be 600 g/cm.

The mask element for sandblasting was then applied to a 7 mm-thick glass plate and the polyethylene terephthalate film in the film B was stripped off. There was observed substantially no peeling resistance between the polyethylene terephthalate film and the layer of ethyl cellulose. Subsequently, the glass plate covered with the mask for sandblasting was sandblasted by means of a siphon-type sandblaster (manufactured and sold by Fuji Seisaku-sho, Japan), using as an abrasive material an alundum (crystal alumina obtained from molten bauxite) having a grain size of #180 according to Japanese Industrial Standard R6001. The sandblasting was effected for 30 seconds under a pneumatic pressure of 3.5 kg/cm$^2$. The desired images were, in the complete form, engraved on the glass plate without breakaway of the mask.

EXAMPLE 2

A mask element was prepared in substantially the same manner as described in Example 1 except that in place of the film B, a 120μ-thick polyethylene terephthalate film having thereon a 4μ-thick layer of cellulose acetate butylate was used. The mask element was attached to a glass plate and subjected to sandblasting in substantially the same manner as described in Example 1. The desired image was, in complete form, engraved on the glass plate.

EXAMPLE 3

86 Parts by weight of a hydrogenated 1,2-polybutadiene having hydroxyl groups at both ends thereof (number average molecular weight: 3000) was reacted with 6 parts by weight of tolylene diisocyanate to obtain a polyurethane having isocyanate groups at both ends thereof. 15 Parts by weight of 2-hydroxypropyl methacrylate was added to the thus obtained polyurethane, and reaction was effected between the polyurethane and the methacrylate thereby to obtain an unsaturated polyurethane having methacrylate groups at both ends thereof. To the thus obtained unsaturated polyurethane were added under agitation 20 parts by weight of lauryl methacrylate, 2 parts by weight of trimethylolpropane trimethacrylate, 3 parts by weight of diethylene glycol dimethacrylate, 1.5 parts by weight of 2,2-dimethoxyphenylacetophenone and 0.1 part by weight of 2,6-di-t-butyl-p-cresol to obtain a liquid photopolymerizable composition. From the photopolymerizable composition, a mask element was prepared in substantially the same manner as described in Example 1. The mask element exhibited a peeling resistance of 650 g/cm against a glass plate.

The mask element was then applied to the surface of a granite plate, and the polyethylene terephthalate film in the film B was stripped off. Subsequently, the granite plate covered with the mask was sandblasted by means of a direct pressure-type sandblaster, using as an abrasive material a carborundum having a grain size of #200 according to Japanese Industrial Standard R6001. The sandblasting was effected for 50 seconds under a pneumatic pressure of 4 Kg/cm². The desired image was, in complete form, engraved on the granite plate without breakaway of the mask.

COMPARATIVE EXAMPLE 1

Mask elements were prepared in substantially the same manner as described in Example 1 except that in place of the film B, a 75μ-thick polyethylene terephthalate film per se and a 75μ-thick polyethylene terephthalate film having thereon a 10μ-thick layer of polymethyl methacrylate were respectively used. Both of the mask elements were, however, not useful due to the chipping of portions of the mask, especially those corresponding to the fine dots and lines of the image, at the time of development.

COMPARATIVE EXAMPLE 2

An unsaturated polyester having an acid value of 23 was obtained by dehydration condensation reaction of 2 moles of maleic anhydride, 1 mole of isophthalic acid and 3 moles of triethylene glycol. Then, 70 parts by weight of the unsaturated polyester, 30 parts by weight of 2-hydroxyethyl methacrylate, 1 part by weight of benzoin isobutyl ether and 0.1 part by weight of 2,6-di-t-butyl-p-cresol were mixed together to obtain a liquid photopolymerizable composition.

From the thus obtained photopolymerizable composition, a mask element was prepared in substantially the same manner as described in Example 1 except that a 1% by weight aqueous solution of sodium borate was used as the developer solution. The mask element exhibited a peeling resistance, against a glass plate, as small as 100 g/cm.

The mask element was applied to the surface of a glass plate, and the polyethylene terephtalate film in the film B was stripped off. Then, sandblasting was attempted under the same conditions as in Example 1, but the mask was detached from the glass plate and, hence, the pattern could not be engraved on the glass plate.

REFERENCE EXAMPLE

Each of the photopolymerizable compositions obtained in Examples 1 and 3 and Comparative Example 2 was put into a space defined by a 9μ-thick polyethylene terephthate film placed on a glass plate and a 2 mm-thick spacer placed on the film. Subsequently, another 9μ-thick polyethylene terephthalate film was laminated onto the surface of the photopolymerizable composition. Onto this film, another glass plate was placed to obtain an assembly. Each corner of the respective assembly was clipped thereby to control the entire thickness of the assembly. Each assembly, on both sides thereof, was exposed to actinic radiation from a light source of ten 20 W ultraviolet fluorescent lamps at a distance of 10 cm for 10 minutes to obtain a photopolymerized sheet. For each sheet, the elongation at break and 100% modulus were measured according to the methods described hereinbefore. The results are shown in Table.

Also, with respect to each of the mask elements obtained in Examples 1 and 3 and Comparative Example 2, the time spent to break down the mask was measured. The results are shown in Table.

TABLE

| Photopolymerizable composition | Elongation at break [%] | 100% molulus [kg/cm²] | Break-down Time [sec] |
| --- | --- | --- | --- |
| Example 1 | 270 | 19 | 25 |
| Example 3 | 150 | 26 | 18 |
| Comparative Example 2 | 5 | — | 2-3 |

What is claimed is:

1. A mask element for selective sandblasting, which comprises a support film layer and, superimposed on the support film layer in the following order, a destroyable retainer film layer of a water-insoluble cellulose derivative and sticky photoresist layer of a predetermined pattern mask constituted by solid image portions and vacant image portions and adherable, without the aid of an adhesive or the aid of the retainer film layer, to the surface of an article body to be engraved with a strength such that the mask is not detached therefrom during sandblasting, said support film layer being adapted to be stripped from the destroyable retainer film layer while maintaining adherence of the destroyable retainer film layer to the photoresist layer, said destroyable retainer film layer being not sticky and not adherable to said surface and being adapted to be destroyed by sandblasting while said solid portions of the photoresist layer are resistant to sandblasting.

2. A mask element according to claim 1, wherein said strength is 300 g/cm or more in terms of peeling resistance.

3. A mask element according to claim 1, wherein said water-insoluble cellulose derivative is at least one member selected from the group consisting of cellulose monocarboxylic esters and alkylcelluloses.

4. A mask element according to claim 1, wherein said solid image portions of the sticky photoresist layer are those which are obtained by photopolymerization of a composition comprising, as a component (a), an unsaturated polyurethane of the formula:

$$B(XA)_nXB'$$

wherein X represents a urethane residue, A represents a residue of a polyether, a polyester, a block copolymer of polyether and polyester, a mixture thereof or a polybutadiene, n represents an integer of 1 to 10, B represents a radical of the formula:

in which Z represents a hydrogen atom or a methyl group, and Y represents $-(CH_2)_{m_1}O-$ in which $m_1$ represents an integer of 2 to 6, in which $m_2$ represents an integer of 1 to 12, or $-(CH_2CH_2O)_{m_3}$ in which $m_3$ represents an integer of 1 to 12, and B' represents a radical of the formula:

in which Z and Y are as defined above or a radical of the formula:

RO— or ROY in which Y is as defined above and R represents an alkyl group having 1 to 8 carbon atoms,
as a component (b), an ethylenically unsaturated compound, and as a component (c), a photopolymerization initiator;
the weight proportions of the components (a), (b) and (c) relative to the total of the components (a) and (b) being, respectively, 50 to 98%, 2 to 50% and 0.05 to 10%.

5. A mask element according to claim 1, wherein the support film layer is a film of a synthetic resin selected from the group consisting of polypropylene, polyesters, polyvinyl chloride, polycarbonate, polystyrene and polyethylene, or a sheet of a metal selected from the group consisting of steel and aluminum.

6. A method for producing a pattern-engraved article, which comprises:
  (1) adhering to the surface of an article body to be engraved one surface of a sticky photoresist layer of a predetermined pattern mask constituted by solid image portions and vacant image portions and adherable, without the aid of an adhesive or the aid of the retainer film layer, to said surface with a strength such that the mask is not detached therefrom during sandblasting,
  said sticky photoresist layer being attached, on its other surface to a support film layer through the medium of a destroyable retainer film layer of a water-insoluble cellulose derivative,
  said support film layer being attached to said destroyable retainer film layer with adherance smaller than the adherance of said sticky photoresist layer to said surface of the article body,
  said support film layer being adapted to be stripped from the destroyable retainer film layer while maintaining adherance of the destroyable retainer film layer to the photoresist layer,
  said destroyable retainer film layer being not sticky and not adherable to said surface and being adapted to be destroyed by sandblasting while said solid portions of the photoresist layer are resistant to sandblasting;
  (2) stripping the support film layer from the destroyable retainer film layer;
  (3) blowing an abrasive material against the destroyable retainer film layer to destroy said retainer film layer, thereby causing said vacant image portions of the sticky photoresist layer to be exposed;
  (4) further blowing an abrasive material through said vacant image portions against the article body to engrave an image corresponding to that of said vacant image portions on the article body; and
  (5) removing the solid portions of the photoresist layer to obtain a pattern-engraved article.

7. A mask element according to claim 1, wherein said strength is 300 g/cm or more in terms of peeling resistance as measured in accordance with a peeling resistance measuring method in which:
  (a) the mask element is cut off, at a portion which has a length of about 30 mm and a width of about 13 mm and does not contain on the destroyable retainer film layer the vacant image portions, to prepare a specimen;
  (b) from the specimen, the support film layer is detached, and the specimen is, on its side of the destroyable retainer film layer, attached to the curved surface of a cylindrical column of aluminum having a height of about 13 mm and a diameter of about 30 mm through the medium of a double faced adhesive tape having a width of about 13 mm or more and a thickness of about 120 microns;
  (c) the surface of the specimen, attached to the cylindrical column, is pressed onto the surface of a glass plate for about 4 seconds under a pressure of about 500 g/cm$^2$ and, subsequently, the cylindrical column is pulled from the glass plate at a rate of about 30 mm/min to determine the maximum value of strength exerted between the surface of the specimen and that of the glass plate; and
  (d) the maximum value of strength is divided by 1.3 to obtain a peeling resistance value.

* * * * *

UNITED STATES PATENT AND TRADEMARK OFFICE
CERTIFICATE OF CORRECTION

PATENT NO. : 4,587,186
DATED : May 6, 1986
INVENTOR(S) : Shohei Nakamura & Yoshimasa Tuji It is certified that error appears in the above-identified patent and that said Letters Patent is hereby corrected as shown below: Figures 1 and 2 will appear as shown below

FIG.1

FIG.2
PRIOR ART

Signed and Sealed this

Twelfth Day of August 1986

[SEAL]

Attest:

DONALD J. QUIGG

Attesting Officer    Commissioner of Patents and Trademarks